Figure 1:
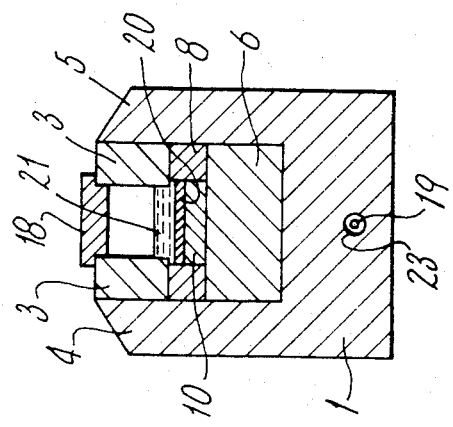

United States Patent [19]

Brice et al.

[11] Patent Number: 4,535,720
[45] Date of Patent: Aug. 20, 1985

[54] LIQUID PHASE EPITAXY APPARATUS

[75] Inventors: John C. Brice, Copthorne Bank; John L. Page, Haywards Heath; Peter A. C. Whiffin, Horsham, all of England

[73] Assignee: U.S. Philips Corporation, New York, N.Y.

[21] Appl. No.: 592,770

[22] Filed: Mar. 26, 1984

[30] Foreign Application Priority Data

Apr. 27, 1983 [GB] United Kingdom ............... 8311429

[51] Int. Cl.³ ........................................... H01L 21/208
[52] U.S. Cl. ..................................... 118/415; 118/421
[58] Field of Search ....................... 118/412, 415, 421; 148/171, 172; 156/621, 622, 624

[56] References Cited

U.S. PATENT DOCUMENTS

| 3,785,884 | 1/1974 | Lockwood | 118/415 X |
| 4,359,012 | 11/1982 | Nishizawa | 118/415 X |
| 4,393,806 | 7/1983 | Mahieu et al. | 118/421 X |

Primary Examiner—John P. McIntosh
Attorney, Agent, or Firm—Paul R. Miller

[57] ABSTRACT

In a sliding boat liquid phase epitaxy apparatus a base structure, a support substrate disposed on the base and being horizontally fixed with respect to the base, and a slidable well member disposed above the substrate in an abutting relationship are included. The slidable well member has at least one well capable of holding a growth solution for growing epitaxial layers on substrates. A significant problem in growth of layers by liquid phase epitaxy when using a sliding boat apparatus occurs by the inability to achieve a sufficiently good wipe-off so as to produce a layer having a smooth surface. The apparatus of the present invention includes in the structure of a sliding boat apparatus a substrate support structure including a block provided with a flat-bottom recess in part of the top surface of the block and between the ends of the blocks, and a plate is fitted into the recess so that the top surface of the plate is level with the top surface of the block outside of the recess. The plate is provided with an aperture capable of containing a substrate on which an epitaxial layer is to be grown, and can be disposed under one well of the slidable well member. The plate and well member are made of different materials.

9 Claims, 4 Drawing Figures

LIQUID PHASE EPITAXY APPARATUS

The invention relates to a sliding boat apparatus suitable for use for the growth of material layers by liquid phase epitaxy.

Sliding boat apparatus has been widely used for the growth by liquid phase epitaxy of layers of semiconductor materials, such as II–VI and III–V alloys and compounds. A significant problem in such growth processes is to remove essentially all the growth solution from the surface of the grown layer immediately after the desired growth has been completed. Failure to achieve good wipe-off results in the exposed surface of the grown layer being irregular and requiring extensive post growth treatment to remove these irregularities and the residual frozen solution prior to further processing. When more than one layer is being grown, post growth treatment is extremely undesirable because there are significant advantages in growing all the desired layers without removing the substrate. In order to ensure good wipe-off, it is necessary to locate the substrate on which the epitaxial layer is grown so that the layer-bearing surface of the substrate before growth and the exposed surface of the grown layer are at reproducible distances below the top surface of the substrate holder in which the substrate is disposed. These distances have to be determined experimentally in each case, but typically the layer surface might be between 5 and 15 micrometers below the top surface of the substrate holder. If the distance is less than 5 $\mu$m, the layer surface may be scratched, and if the distance exceeds 15 $\mu$m, significant amounts of solution remain on the layer surface and result in irregularities remaining on this surface.

It has been found that when the growth solution wets both the substrate on which an epitaxial layer is grown, and the material of the substrate holder in which the substrate is disposed, the growth solution tends to be drawn by capillary action into the essentially vertical gaps between the periphery of the substrate and the internal side walls of the substrate holder. This solution solidifies during cooling of the apparatus, and it may then be difficult to remove the substrate from the substrate holder. This problem is more severe when the growth solution has a low kinematic viscosity (less than a few mm$^2$/s) and a small surface tension (say <200 mN/m), and a small contact angle (<45°) with the substrate on which the epitaxial layer is grown.

The choice of materials used to make a sliding boat apparatus may be restricted by the need to avoid contamination of the substrate, the growth solution, or the grown layer. There are further limitations since the components of the apparatus must slide smoothly without any trace of friability. Various grades of synthetic graphite are used for making sliding boat apparatus for the growth of both III–V and II–VI compounds from solutions composed, for example, of a quantity of one component dissolved in an excess of the other component. For the growth of GaAs by such a method the solution consists of a small quantity of arsenic dissolved in a large excess of gallium. Alternatively other solutions may be used, for example, GaAs may be grown from a solution of gallium arsenide in tin. However, if such growth solutions wet graphite and the sliding boat apparatus is made entirely of graphite, the above-mentioned sticking problem may occur. It will then be necessary to make the substrate holder of a material that is not wetted by the growth solution.

An object of the invention is to reduce the cost of producing a sliding boat apparatus.

The invention provides a sliding boat liquid phase epitaxy apparatus comprising a base, substrate support means disposed on the base and fixed in a horizontal sense with respect to the base, and a slidable well member abutting and disposed above the substrate support means and having at least one well capable of containing growth solution, slidable movement of the well member being in the length direction of the apparatus, wherein the substrate support means comprise a block provided with a flat-bottomed recess in part of the top surface of the block between the ends of the block, and a plate fitting into the recess so that the top surface of the plate is level with the top surface of the block outside the recess, which plate is provided with an aperture capable of containing a substrate on which an epitaxial layer is to be grown, wherein the aperture can be disposed under the/each well, and wherein the plate material is different from the well member material.

In a conventional sliding boat apparatus, the substrate holder is a recess in the slide which only extends into part of the thickness of the slide. It is generally not possible to machine such a recess which has a uniform depth across the whole area in materials which are as hard as vitreous silica. When the depth of the recess is not uniform, it may not be possible to locate the substrate with respect to the top surface of the slide with the accuracy required for achieving satisfactory wipe-off. The substrate support means in an apparatus according to the invention makes it possible to support the substrate accurately parallel to the top surface of the plate. The recess in the block is appreciably larger than the aperture in the plate, and so the top surface of this recess can be ground so as to be accurately parallel with the top surface of the remainder of the block. Preferably the recess extends across the whole width of the block, since this simplifies the provision of the recess. Since the junctions of the bottom of the recess with the walls of the recess are normally curved, it is desirable for the edges of the bottom of the plate adjacent to these walls to be bevelled. A spacing plate which fits in the aperture may be disposed on the bottom of the recess in order to locate a substrate at a desired distance below the top surface of the apertured plate.

The wipe-off characteristics of a sliding boat apparatus according to the invention may be improved by the provision of a plurality of grooves on the underside of the well member on the side of the/each well which traverses the aperture in the plate after growth of an epitaxial layer, which grooves extend across at least a width of the well member which is greater than and includes the width of the aperture. Our British application No. 8311428 of even date describes and claims a sliding boat liquid phase epitaxy apparatus comprising a base member, substrate support means superposed on the base member, and a well member abutting and disposed above the substrate support means and having at least one well capable of containing growth solution, the substrate support means comprising a recessed substrate holder which can be disposed under and in registration with the/each well, wherein the well member and the substrate support means are relatively slidable in the length direction of the apparatus, wherein the bottom of the well member is provided with a plurality of grooves on the side of the/each well which traverses or is traversed by the recessed substrate holder after growth of an epitaxial layer, and wherein the grooves extend across at least a width of the well member which is greater than and includes the width of the substrate holder recess.

When growing epitaxial layers of tellurides of group II metals from solutions in tellurium, vitreous silica is a satisfactory material for the apertured plate and any spacing plate, the remainder of the apparatus consisting of synthetic graphite. When using tellurium or gallium solutions, the apertured plate may be fabricated, for example, from a monocrystalline plate consisting of sapphire or of yttrium aluminium garnet.

Figure 2:
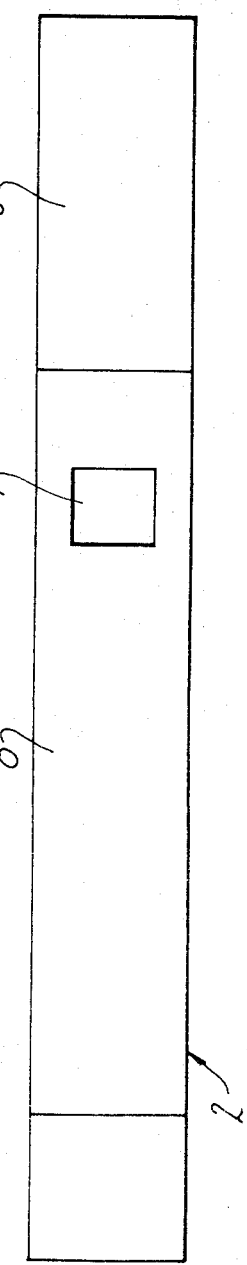
Figure 3:
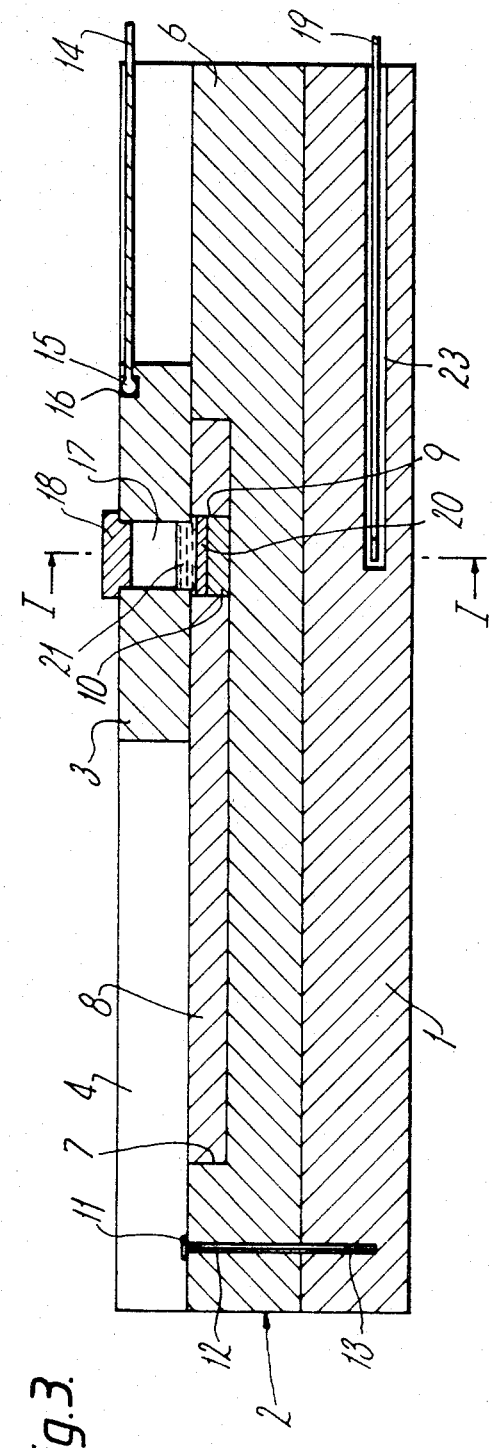
Figure 4:
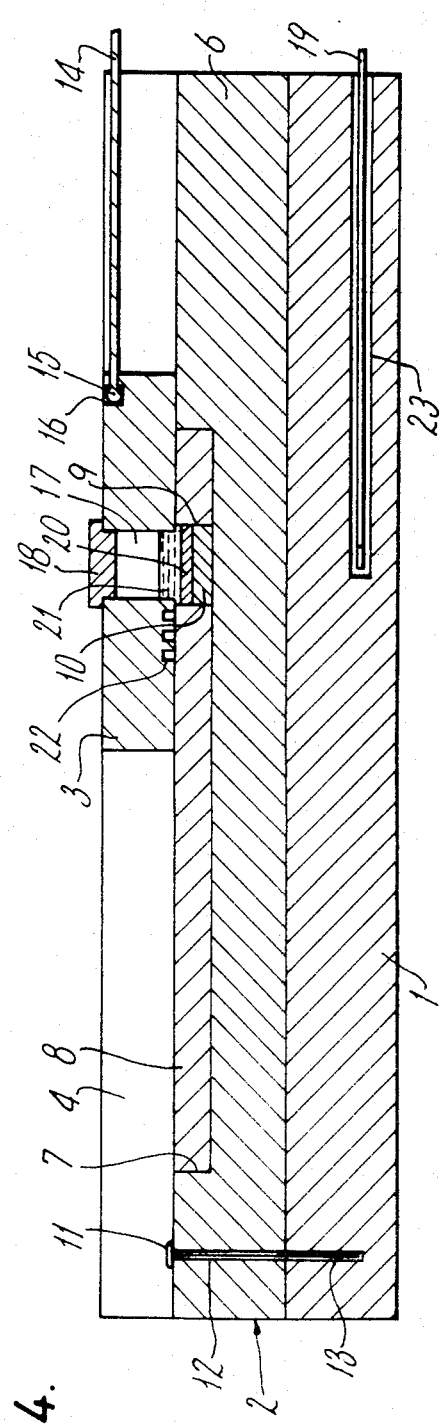

Two embodiments of the invention will now be described with reference to the Examples and to the accompanying drawings, in which:

FIG. 1 is a cross-section of a sliding boat apparatus according to the invention, taken on the line I—I shown in FIG. 3 and viewed in the direction of the arrows, FIG. 2 is a plan view of a substrate support means which is part of the apparatus shown in FIG. 1, FIG. 3 is a longitudinal section of the apparatus shown in FIG. 1, and FIG. 4 is a longitudinal section of another sliding boat apparatus according to the invention.

EXAMPLE 1

Referring to FIG. 1, a sliding boat apparatus comprises a graphite base 1 supporting substrate support means 2 (see FIG. 2) and a graphite well member 3 which are located between side walls 4 and 5 of the base. The substrate support means 2 comprise a vitreous silica block 6 provided on its upper side with a flat-bottomed recess 7 (see FIG. 3) which extends across the width of the block 6 and is disposed between the ends of the block 6, an apertured vitreous silica plate 8 which fits into the recess 7 in the block 6, and a vitreous silica spacing plate 10 which rests on the bottom of the recess 7 and fits in the aperture 9. The aperture 9 was produced in plate 8 by ultrasonic machining. The recess 7 was formed by grinding and the lower end boundaries of the recess 7 are curved. Accordingly the lower end edges of the plate 8 are bevelled so that the plate 8 rests only on the flat part of the surface of the recess 7.

The substrate support means 2 are secured with respect to the base 1 by means of a graphite pin 11 (see FIG. 3) which passes through a bore 12 in the block 6 into a blind bore 13 in the base 1. The graphite well member 3 is superimposed on the substrate support means 2 and is located between the side walls 4 and 5 of the base 1. The well member 3 can be moved in the length direction of the apparatus by means of a silica operating rod 14 having a head 15 which is located in a recess 16 near the right hand end (FIG. 3) of the well member 3.

The well member 3 is provided with a well 17 having a circular cross-section which is smaller than the aperture 9. The top of the well 17 is closed by a graphite lid 18. A longitudinal bore 23 in the base 1 ends below the aperture 9 and houses a thermocouple 19 which is used to measure the growth temperature.

An epitaxial layer was grown on a polished substrate 20 which had been placed on the spacing plate 10 in the aperture 9, the top surface of the substrate 20 being 30 $\mu$m below the top surface of the plate 8. The well member was initially situated so that the well 17 was situated to the left (in FIG. 3) of the substrate 20. A solid charge consisting of a growth solution 21 was then placed in the well 17, the lid 18 was placed in the well 17, and the apparatus was placed in a tubular furnace (not shown).

A protective atmosphere was introduced into the furnace, and the apparatus was heated to a temperature 5 degrees above the growth temperature. The temperature was then lowered to the growth temperature, and when the growth temperature had been reached, the well member 3 was slid to the position shown in FIG. 3, so that the substrate 20 was covered by the liquid growth solution 21. The temperature of the apparatus was progressively lowered and growth was terminated by moving the well member to the right (FIG. 3). At the end of the growth process the top face of the grown layer was 10 $\mu$m below the top surface of the plate 8. It was found that when the growth solution was a solution of a telluride of a group II metal in tellurium, there was no difficulty in removing the substrate 20 from the aperture 9 after growth of an epitaxial layer had been completed. This would not have been the case had the substrate holder been made of graphite.

EXAMPLE 2

The apparatus shown in FIG. 4 only differs from the apparatus described in Example 1 with reference to FIGS. 1 to 3 in that the well member 3 is provided with three transverse grooves 22 on the bottom surface adjacent to and on the left side (in FIG. 4) of the well 17. Each groove 22 has a square cross-section of 3 mm side and extends across the width of the well member 5. By providing grooves 22 on the bottom of the well member 3, a plurality of edges sweep over and above the grown layer, the top of which layer is, for example, 10 $\mu$m below the top of the surface of the plate 8. This sweeping action results in drops of growth solution 21 which may remain on the grown layer after this layer has been traversed by the edge of the well 17, being swept into and retained in the grooves 22.

We claim:

1. A sliding boat liquid phase epitaxy apparatus comprising
  a supporting base structure;
  a substrate supporting structure disposed on said base structure, said supporting structure being horizontally fixed with respect to said base structure;
  wherein said supporting structure includes a block member on said base structure; a flat-bottom recess in a portion of the top surface of said block member, said recess being located between ends of said block member; and a plate member fitted into said recess so that said plate member has a top surface level with the top surface of said block member outside of said plate member, said plate member having an aperture for containing a substrate for epitaxial growth; and
  a slidable well member disposed above said substrate supporting structure in abutting relationship, said well member having at least one well containing growth solution, and said well member being slidable in the length direction of said base structure;
  wherein said aperture of said plate member can be disposed beneath said well, and
  wherein said plate member is a material different from material of said well member.

2. A sliding boat liquid phase epitaxy apparatus according to claim 1, wherein said recess extends across the width of said block member.

3. A sliding boat liquid phase epitaxy apparatus according to claim 2, wherein said substrate supporting structure includes a spacing plate disposed in said aperture, said spacing plate resting on said block member at the bottom of said aperture.

4. A sliding boat liquid phase epitaxy apparatus according to claim 1, wherein said substrate supporting structure includes a spacing plate disposed in said aperture, said spacing plate resting on said block member at the bottom of said aperture.

5. A sliding boat liquid phase epitaxy apparatus according to claim 1 or claim 2 or claim 3 or claim 4, wherein said well member consists of graphite and said plate member consists of vitreous silica.

6. A sliding boat liquid phase epitaxy apparatus according to claim 5, wherein said well member has a plurality of grooves in a side abutting said substrate supporting structure, and wherein said grooves extend across the width of said well member, said width of said well member being greater than and including the width of said aperture.

7. A sliding boat liquid phase epitaxy apparatus according to claim 6, wherein said grooves are straight.

8. A sliding boat liquid phase epitaxy apparatus according to claim 1 or claim 2 or claim 3 or claim 4, wherein said well member has a plurality of grooves in a side abutting said substrate supporting structure, and wherein said grooves extend across the width of said well member, said width of said well member being greater than and including the width of said aperture.

9. A sliding boat liquid phase epitaxy apparatus according to claim 8, wherein said grooves are straight.

* * * * *